United States Patent [19]

Scrantom et al.

[11] Patent Number: 4,670,977

[45] Date of Patent: Jun. 9, 1987

[54] INSERTER DEVICE FOR ELECTRONIC COMPONENTS

[75] Inventors: Dehart G. Scrantom, Shallotte, N.C.; E. David Shealey, Myrtle Beach, S.C.

[73] Assignee: AVX Corporation, Great Neck, N.Y.

[21] Appl. No.: 719,243

[22] Filed: Apr. 2, 1985

Related U.S. Application Data

[60] Division of Ser. No. 556,982, Dec. 1, 1983, Pat. No. 4,539,740, which is a continuation-in-part of Ser. No. 368,670, Apr. 15, 1982, Pat. No. 4,455,735.

[51] Int. Cl.$^4$ .............................................. B23P 19/00
[52] U.S. Cl. ........................................ 29/741; 29/709; 29/809; 29/33 M; 414/417
[58] Field of Search .............. 29/741, 709, 33 M, 809; 414/403, 416, 417, 331

[56] References Cited

U.S. PATENT DOCUMENTS

| | | | |
|---|---|---|---|
| 2,850,737 | 9/1958 | Walsh | 227/116 |
| 3,200,481 | 8/1965 | Lenders | 29/741 |
| 4,166,562 | 9/1979 | Keizer et al. | 228/5.1 |
| 4,329,776 | 5/1982 | Mori et al. | 29/834 |
| 4,403,390 | 9/1983 | Woodman, Jr. | 29/741 |

Primary Examiner—Percy W. Echols
Attorney, Agent, or Firm—Arthur B. Colvin

[57] ABSTRACT

The present invention relates to an apparatus and method for rapidly and accurately inserting axial lead components such as capacitors and resistors or the like into printed circuit boards mounted in an X-Y PC board positioning device. In accordance with the invention a plurality of magazines each of which contain a multiplicity of the components are loaded into a receiver chute of the apparatus. The apparatus functions, responsive to a signal from the PC positioning device, to remove an individual component from a magazine, deflect the leads to a position at right angles to the body of the component and insert the thus formed leads accurately into spaced apertures of the PC board which have been manuvered by the X-Y apparatus to a component receiver station. The device includes means for automatically removing exhausted magazines and replacing the same with filled magazines.

10 Claims, 25 Drawing Figures

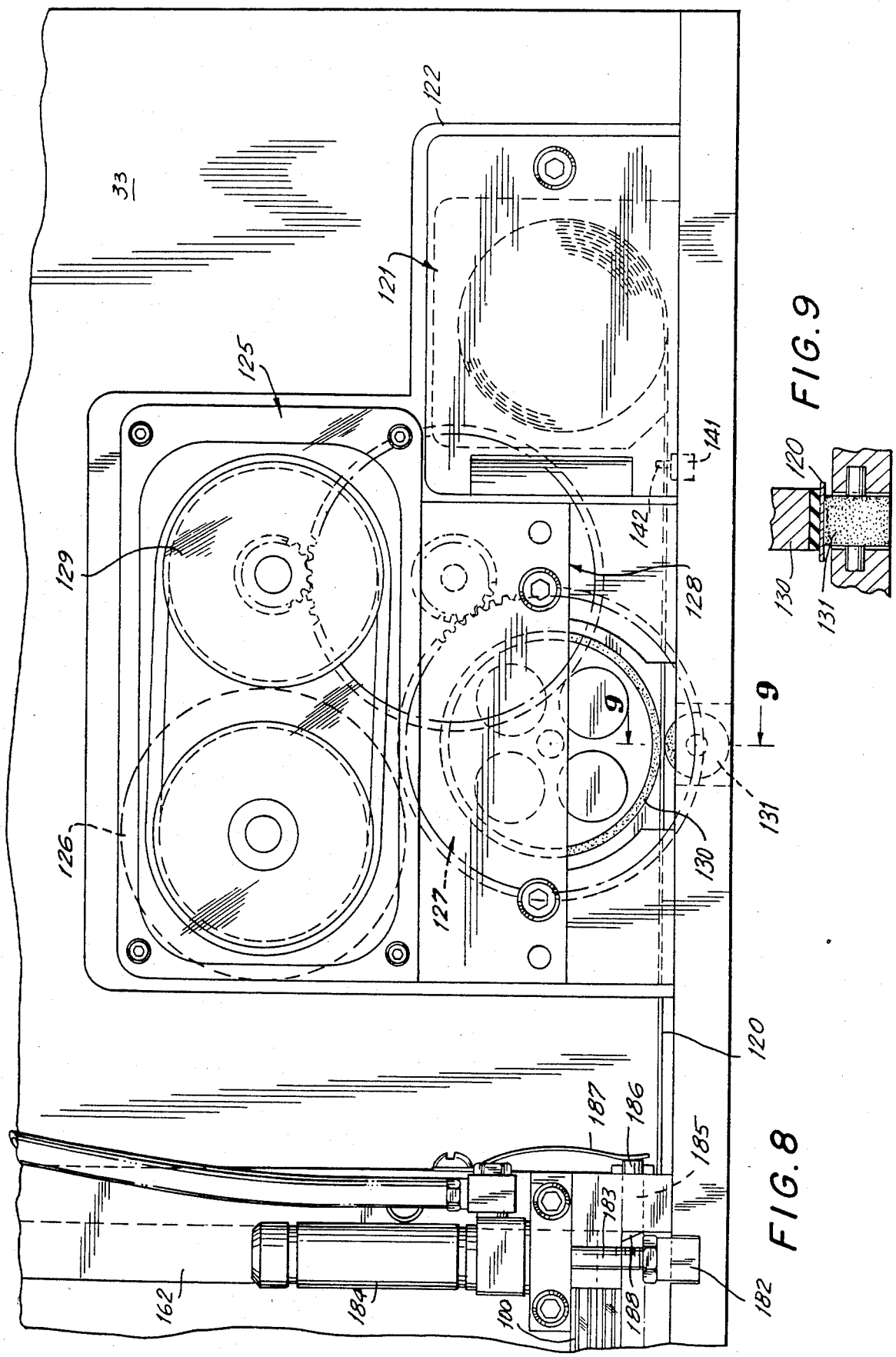

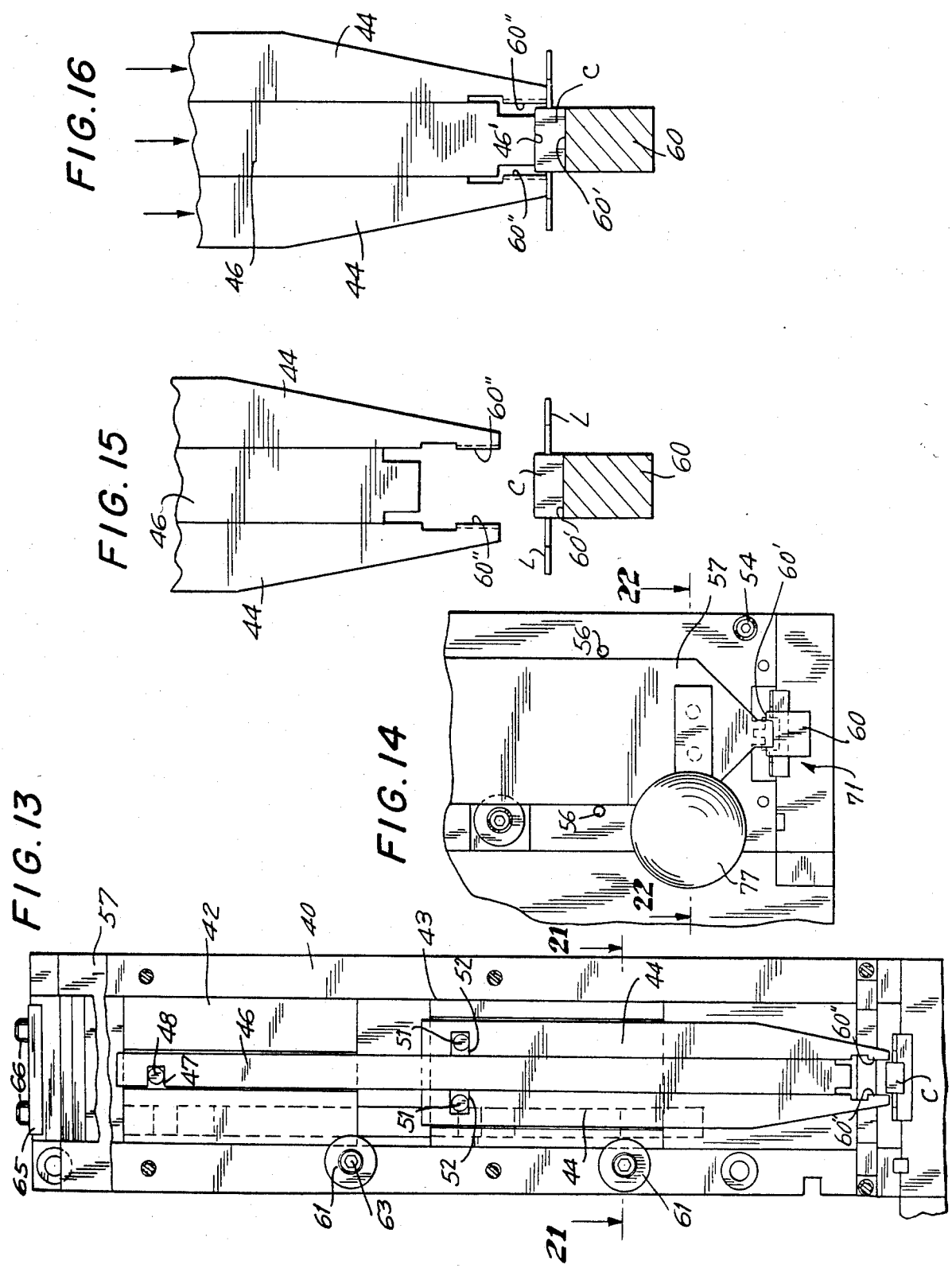

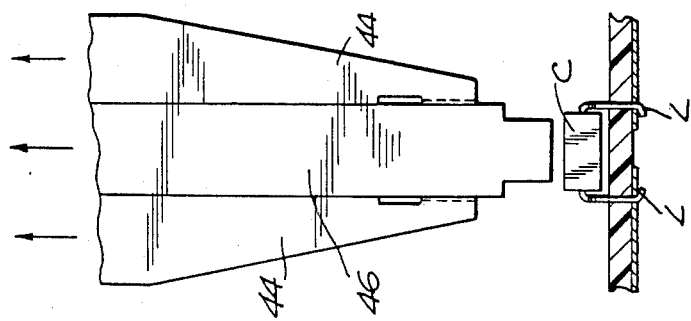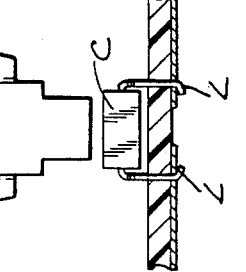
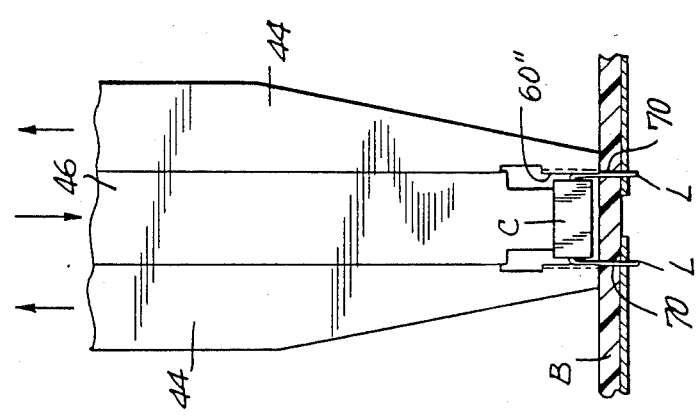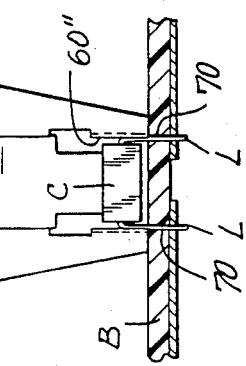
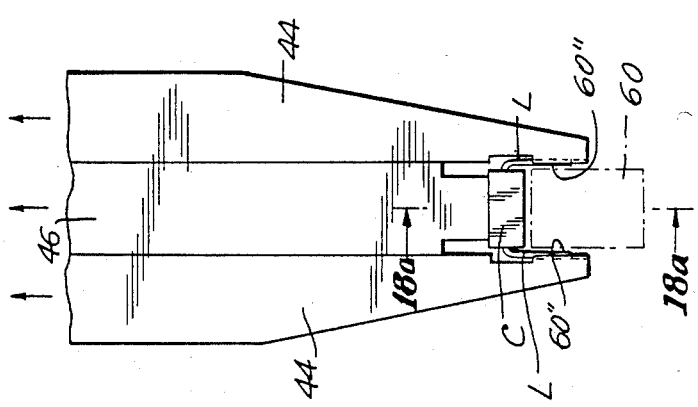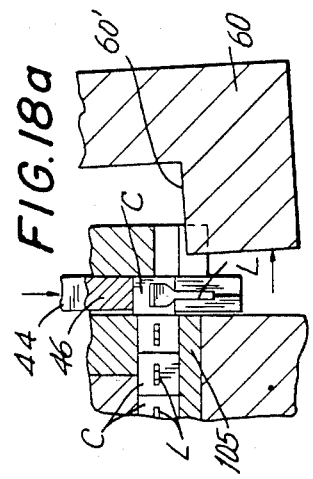
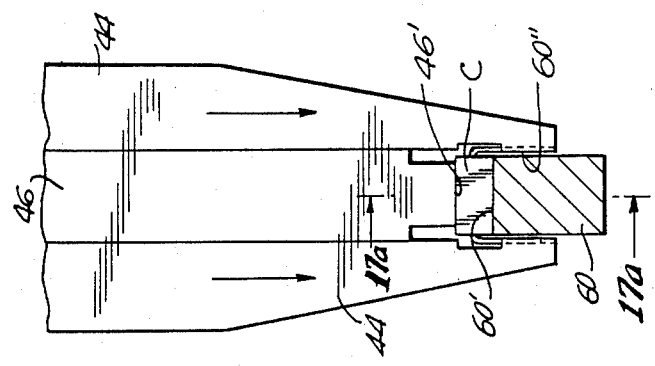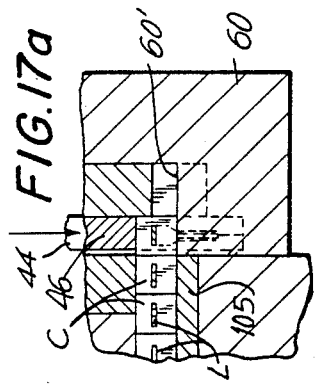

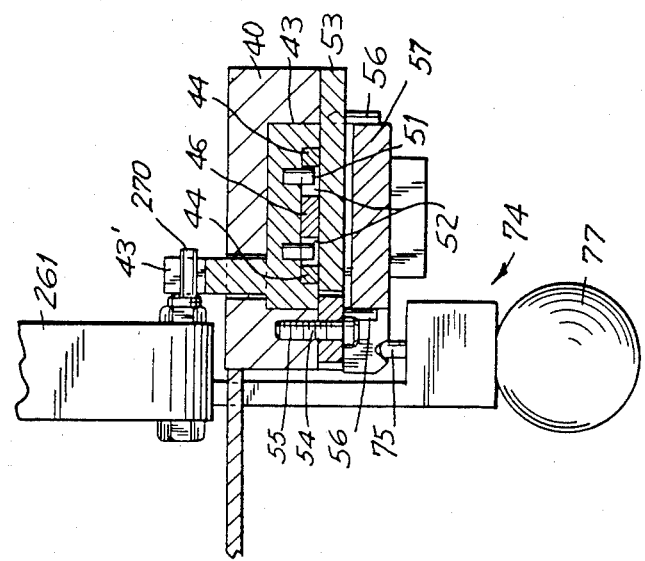
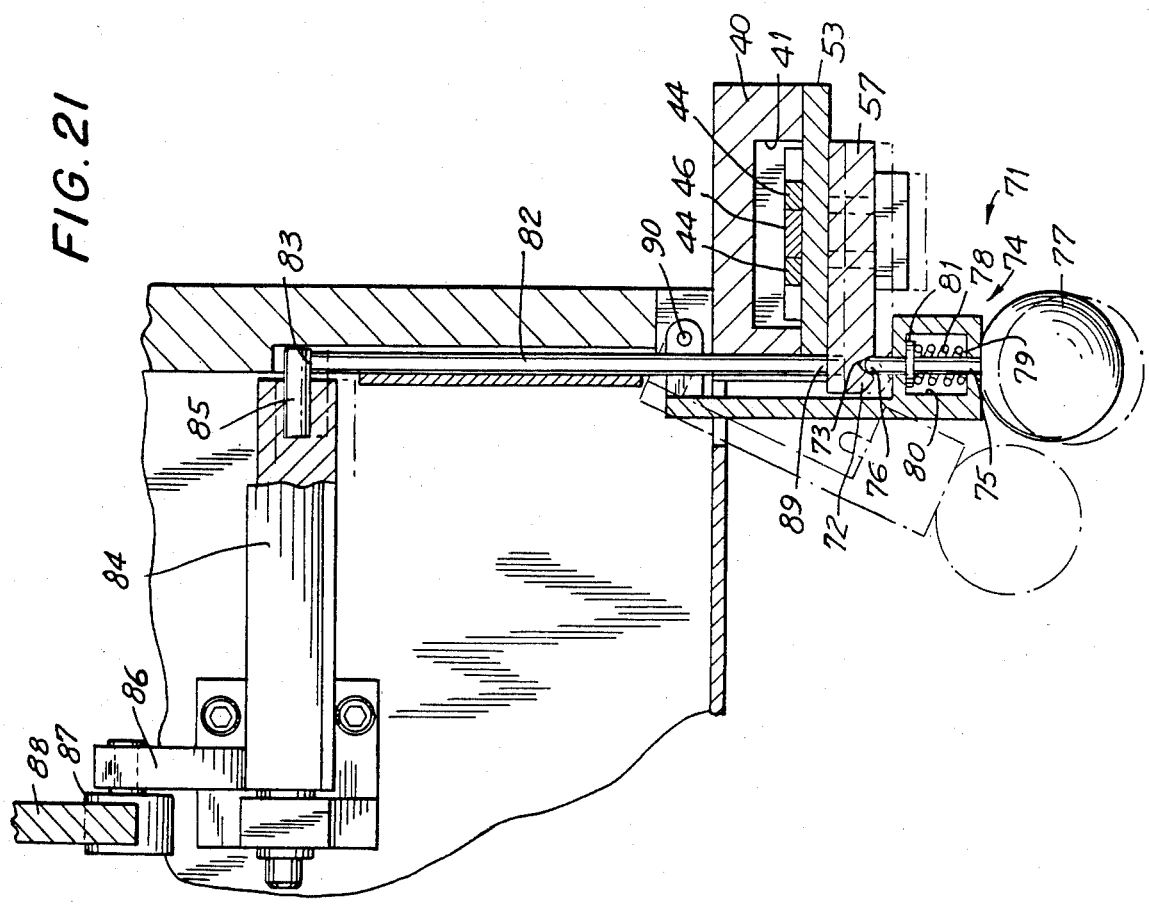

INSERTER DEVICE FOR ELECTRONIC COMPONENTS

This application is a division of copending application Ser. No. 556,982, filed Dec. 1, 1983, now U.S. Pat. No. 4,539,740 which application is a continuation-in-part of application Ser. No. 368,670 filed Apr. 15, 1982 now U.S. Pat. No. 4,455,735 and entitled Apparatus and Method for Filling Printed Circuit Boards, owned by the assignee of the instant application.

BACKGROUND OF THE INVENTION

1. Field of the Invention

The present invention is in the field of apparatus for filling printed circuit boards and pertains more particularly to an apparatus which is capable of processing axial lead electronic components, such as capacitors, resistors and the like by first deflecting the leads to the perpendicular position necessary for the utilization of a printed circuit board and thereafter inserting the components into appropriately positioned apertures of a PC board. The invention is further directed to apparatus which is capable of effecting component form and feed at rapid rates of up to 10,000 or more units per hour.

A further aspect of the invention pertains to a novel magazine assembly in which the electronic components are stored and to an interfacing apparatus whereby magazines which have been exhausted of components are automatically removed and fresh magazines automatically fed into operative arrangement with the insertion device.

Still more particularly the invention is directed to an apparatus which is capable of forming and feeding to PC boards electronic components of the axial lead type at rates of 10,000 or more units per hour in contrast to devices heretofore known wherein maximum production rates of from 1,000 to 2,000 per hour may be achieved.

2. The Prior Art

It is conventional practice in the fabrication of electronic devices to provide a matrix of insulating material having formed thereon a multiplicity of conductive paths, such devices being conventionally known as printed circuit or PC boards. Spaced apertures are formed in the PC boards in registry with the various conductive paths on the boards. The electronic device is processed by inserting the leads of appropriate components, such as capacitors, resistors or the like into appropriate apertures in the board at which position the component will bridge certain conductive paths of the board. The procedure of inserting components into PC boards is known generally as "stuffing the boards".

Typically, to assure that the components will remain in their appropriate positions and to provide a secure electrical contact a solder connection is effected on the reverse face of the boards between the leads and conductive paths. The solder connections may be effected either individually as each component is loaded to the board, or more typically in accordance with modern practice the solder connections are effected simultaneously in accordance with any of a number of gang soldering techniques.

Hand stuffing of PC boards is a time consuming procedure typically involving first bending the leads of an axial electronic component, inserting the leads, clipping off excess and thereafter soldering.

More recently, semi-automatic devices have been employed to expedite the stuffing procedure. Such devices typically include a so called X-Y indexing table wherein a PC board may be mounted and progressively articulated through a series of orientations, each of which is calculated to dispose an appropriate pair or plurality of apertures of the board in precisely oriented relation at a loading station.

Inserter devices heretofore known require that the components employed be preformed in such manner that the axially extending leads of the components as manufactured are deflected to parallel spaced relation corresponding to the standardized spacing of paired holes in the PC boards. The automatic feeding of components having pre-bent leads presents significant mechanical problems. Additionally, devices of the types heretofore known have gripped components having pre-bent leads by pressure exerted against the body portion of the component. It will be readily recognized that in the event that the lead components are not precisely oriented with the desired spacing or are distorted in handling from such desired spacing by even minute amounts, the free ends of the leads will not enter into the apertures of the PC board, which typically are of a diameter of perhaps of a 32nd of an inch. Obviously, a board having one or more improperly positioned electronic components will be defective and must be reprocessed or scrapped.

While it is feasible for the manufacturer of the electronic component to accurately deflect the leads of the component to the desired parallel condition there is a strong susceptibility of the leads to become distorted during shipping and handling. A further difficulty inhering in inserter devices heretofore known resides in the down time necessitated when an initial supply of electronic components fed to the machine is exhausted. This down time is necessitated by the requirement that a bulk supply container be removed and substituted when the supply of components has been exhausted.

In the above referenced U.S. Pat. No. 4,455,735 there is disclosed an improved inserter mechanism capable of rapid and accurate processing of electronic components into assembled position within PC boards. The noted unit accepts axial lead components, processing the same by progressively feeding the units in their axial lead condition to an inserter assembly which progressively deflects the leads to the desired right angled position relative to the body, and thereafter feeds the lead-formed component into inserted position in the PC board. A drawback of the noted device, however, resides in the fact that there is still necessitated a certain down time after a cartridge or magazine containing the electronic components is exhausted. Additionally, occasional feed interruptions were experienced in respect of the magazine assembly in accordance with the noted application. Also, in the said prior application, the leads of a component were formed in one operative cycle of the machine and fed in a subsequent cycle.

SUMMARY OF THE INVENTION

The present invention may be summarized as directed to an improved apparatus for use in conjunction with an X-Y circuit board positioner, which functions accurately and with a minimum of down time to deform the axial leads of electronic components to a desired parallel orientation and to feed the thus deformed components into the apertures of a PC board.

More particularly, the apparatus is comprised of an inserter head assembly in combination with a component supply assembly. The component supply assembly is comprised of a mechanism for receiving a multiplicity of tubes in the nature of magazines or cartridges loaded with electronic components disposed in side by side relation. The mechanism includes a supply chute wherein filled magazines are stored and a discharge chute to which the magazines are shifted following exhaustion of the contents of the magazine. Automatic means are provided for feeding the contents of a given magazine seriatum to the inserter mechanism which automatic means function responsive to exhaustion of a supply to shift the exhausted tube from the supply chute to the discharge chute and to insert a filled magazine into position for supplying components to the inserter head mechanism.

The invention is further directed to an improved inserter mechanism characterized by the provision of an anvil member having a support surface for the body and lead portions of components received from the feed mechanism. The inserter mechanism includes a bifurcate forming and inserting blade assembly and a stripper member disposed between the tines of the forming and inserting member. The operating sequence provides that a component is fed to the support surface of the anvil following which the bifurcate member is shifted in straddling relation of the body of the component and anvil to deflect the leads of the component over the support blades of the anvil to the desired parallel condition. The component is clamped against the anvil by the stripper blade during formation of the leads. Following formation of the leads the bifurcate member and stripper are slightly retracted, the component being frictionally mounted between the bifurcate tines during such retractile movement. While the stripper and bifurcate member are retracted and the component thus lifted from the anvil surface, the anvil is shifted clear of the insertion path. With the anvil cleared from the insertion path the bifurcate member and stripper blade are moved downwardly along the insertion path advancing deformed leads of the component through the PC board apertures disposed at an insertion station. After the component has been inserted the bifurcate member is shifted away from the insertion station while the component is retained in position adjacent the PC board by the still downwardly shifted stripper blade member. After the component leads have been cleared from the tines of the bifurcate member the stripper blade is shifted upwardly to its uppermost or component receiving position. Optionally, but preferably the leads of the component are clinched at a position beneath the PC board by apparatus known per se while the stripper blade retains the component in its desired position adjacent the PC board.

It is accordingly an object of the invention to provide an improved inserter device capable of rapidly and accurately transferring electronic components such as capacitors from storage tubes or magazines into inserted position within a PC board mounted on an X-Y table.

A further object of the invention is the provision of a device of the type described having a novel magazine handling assembly whereby down time of the apparatus is minimized since the device automatically removes spent magazines and advances filled magazines into position to feed the forming and inserting mechanism.

Still further objects of the invention reside in providing an apparatus of the type described which is capable of functioning at high speeds to process 10,000 or more electronic components per hour.

Still other objects of the invention will appear hereinafter in connection with the detailed description of the inserter device and method.

In order to attain these objects and such other and further objects as may appear herein or maybe hereinafter pointed out reference is made to the accompanying drawings in which:

FIG. 8 is a side elevation taken in the direction of the arrows 8—8 of FIG. 2;

FIG. 9 is a fragmentary section taken on the line 9—9 of FIG. 8;

FIG. 13 is a magnified fragmentary front elevational view taken in the direction of the arrows 13—13 of FIG. 10.

FIG. 14 is a front elevational view taken in the direction of line 14—14 of FIG. 10;

FIGS. 15 through 20 are magnified fragmentary front elevational views illustrating the forming and inserting of an electronic component into a printed circuit board at progressive stages of this operation;

FIGS. 17a and 18a are sectional views taken on the lines 17a and 18a of FIGS. 17 and 18 respectively;

FIG. 21 is a horizontal cross-sectional view taken on the line 21—21 of FIG. 13.

FIG. 22 is a horizontal cross-sectional view taken on line 22—22 of FIG. 14.

Figure 23:
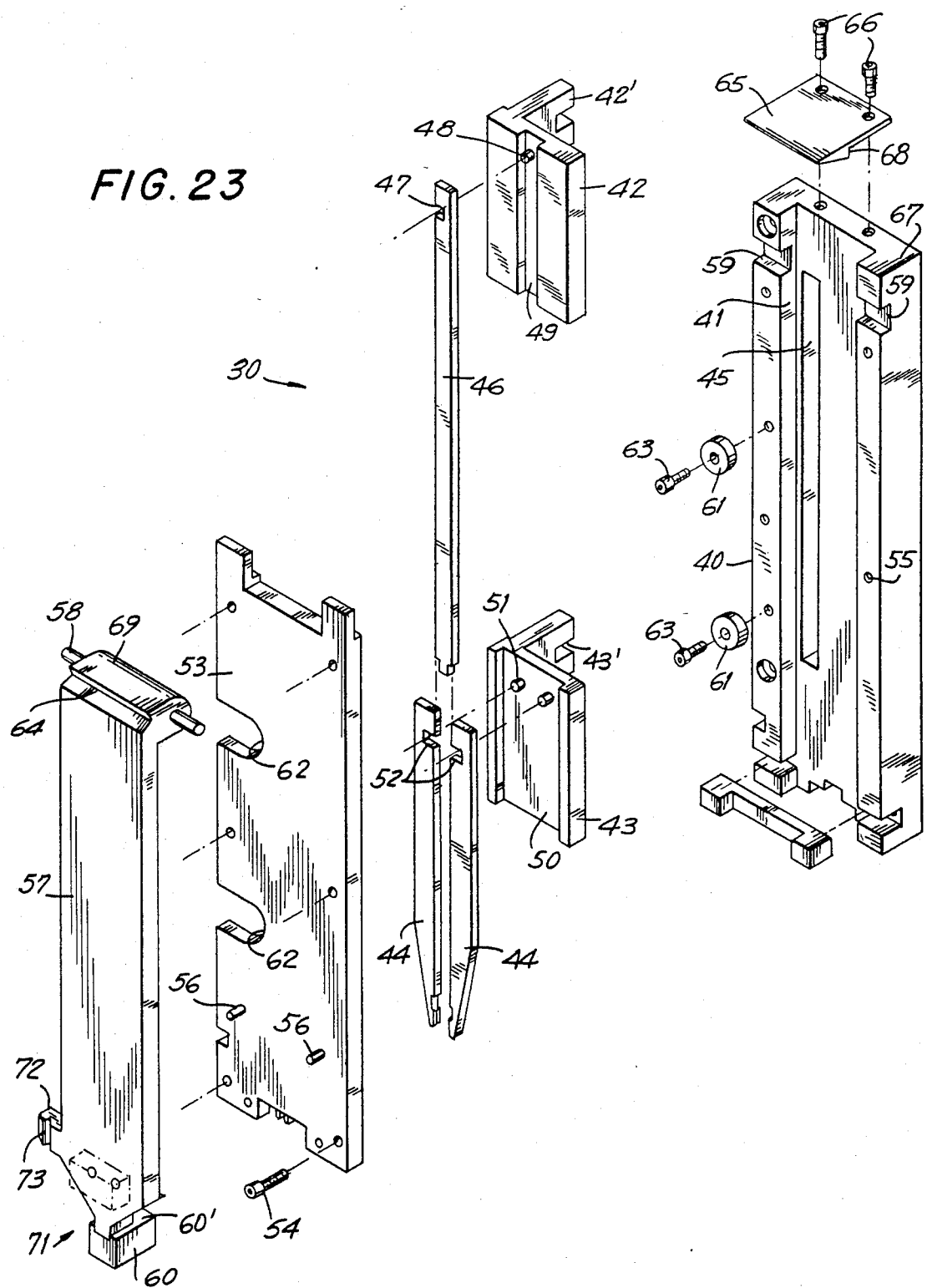

FIG. 23 is an exploded perspective view of the parts forming the inserting unit.

The inserter device is comprised of a series of subassemblies namely:

1. A forming and inserting mechanism;
2. A unit feed mechanism;
3. A magazine feed eject and stack mechanism; and
4. A synchronous drive system.

GENERAL ASSEMBLY

The inserter mechanism referred to generally in the drawings by the reference numeral 10 is disclosed as mounted on a casting 11 fixed to a table 12 on which is mounted a conventional X-Y positioning device referred to generally by the reference numeral 13. The positioning device which is known per se comprises a base frame 14 seated on the table 12. The base frame 14 carries a spaced pair of guide rods 15—15, which rods form a sliding support for an upper frame assembly 16.

The upper frame assembly 16 likewise includes spaced guide rods 17—17 which are disposed perpendicularly to the rods 15. A PC board support frame 18 is movably mounted on the rods 17. A carousel table 19 is rotatably mounted on the support frame 18 between spaced guide bearings 20, a rotary drive mechanism 21 engaging the periphery of table 19 to enable the table to be rotated within the confines of bearings 20. The table 19 includes a central receiver aperture 22 within which aperture may be clamped, a PC board within an automatic clamping mechanism not shown and forming no part of the present invention.

As will be perceived from the above general description the table 19 may be articulated toward or away from casting 11 by drive means which shift frame 16 along rods 15. In similar fashion the frame 18 may be shifted from side to side along the parallel guide rods 17. Finally, the PC board support table 19 may be rotated to any desired angular position by the drive motor 21. Drive mechanism for effecting all of the noted movements is provided as is conventional, whereby the table 19 and concomitantly a PC board supported therein may be automatically indexed to any desired position relative to the inserter mechanism 10 in acordance with a preset program, so as to accurately orient sequentially selected paired apertures of the PC board in position to receive the leads of electronic components.

As is further conventional, the X-Y positioning mechanism 13 includes signal means which interface with the inserter mechanism whereby the inserter mechanism is triggered through an operative cycle responsive to the X-Y table establishing a pre-programmed position, and the table referenced to a subsequent position responsive to completion of an insertion cycle.

THE INSERTER MECHANISM

The inserter mechanism 10 includes an inserter head 30 supported on a frame structure 31 secured to the casting 11. The structure 31 includes left and right vertical plates 32-33 respectively, bolted to a base plate 34 mounted on casting 11. The drive mechanism for activating the inserter head 30 is disposed between the plates 32-33. This mechanism will be described in detail hereinafter. It being understood, however, that it is a function of the mechanism to drive the components of the inserter and former head 30 in timed relation to perform an operative cycle. The functioning and sequential operation of the forming and inserter mechanism 30 will best be appreciated by reference to FIGS. 13 through 23.

The inserter mechanism 30 includes a back housing member 40 defining a vertically directed guide channel 41. The guide channel 41 carries vertically reciprocable stripper blade drive member 42 and a carrier body 43 to which are attached to forming blades 44—44. Driving connection with the carriers 42 and 43 is effected by rearwardly directed drive forks 42'-43' respectively which extend rearwardly through a vertically directed slot 45 formed through the guide channel 41.

The stripper carrier 42 is operatively connected to a stripper blade member 46 by a drive connection formed by a cutout 47 at the upper end of the stripper blade 46 encompassing a drive pin 48 on the stipper carrier 42. The blade 46 is located in a channel 49 in the stripper carrier to assure a precise vertical movement thereof.

Similarly, the forming blade carrier 43 includes a vertical channel 50 having drive pins 51—51 which are disposed in cutouts 52—52 in the forming blades 44—44. The components are maintained in sliding arrangement by a cover plate 53 which is held as by machine screws 54 to complemental threaded apertures 55 formed in the guide member 40. The cover plate includes a pair of forwardly projecting studs 56—56 which define limits for confining the side to side movement of the anvil carrier member 57 next to be described.

The anvil carrier member 57 is provided at its upper end with a cross pin 58 the laterally projecting ends of which ride within retainer slots 59—59 formed in the guide plate 40. From the foregoing, it will be seen that the carrier member 57 is free to pivot in a vertical plane about the horizontal pivot axis defined by the pins 58. The carrier member 57 supports at its lower end an anvil member 60 which defines the surface about which the components are formed in the course of an operative cycle. The positions of the stripper and forming blade carriers, 42 and 43, are maintained when cover plate 53 is removed by locater washers 61—61 extending through cut outs 62—62 of the cover plate, the washers being bolted to the guide 40 as by machine screws 63—63.

The anvil carrier 57 includes at its upper end a notch 64 extending transversely there across. A detent spring of the leaf type 65 is fastened as by machine screws 66 to the upper end 67 of the guide 40.

Figure 4:
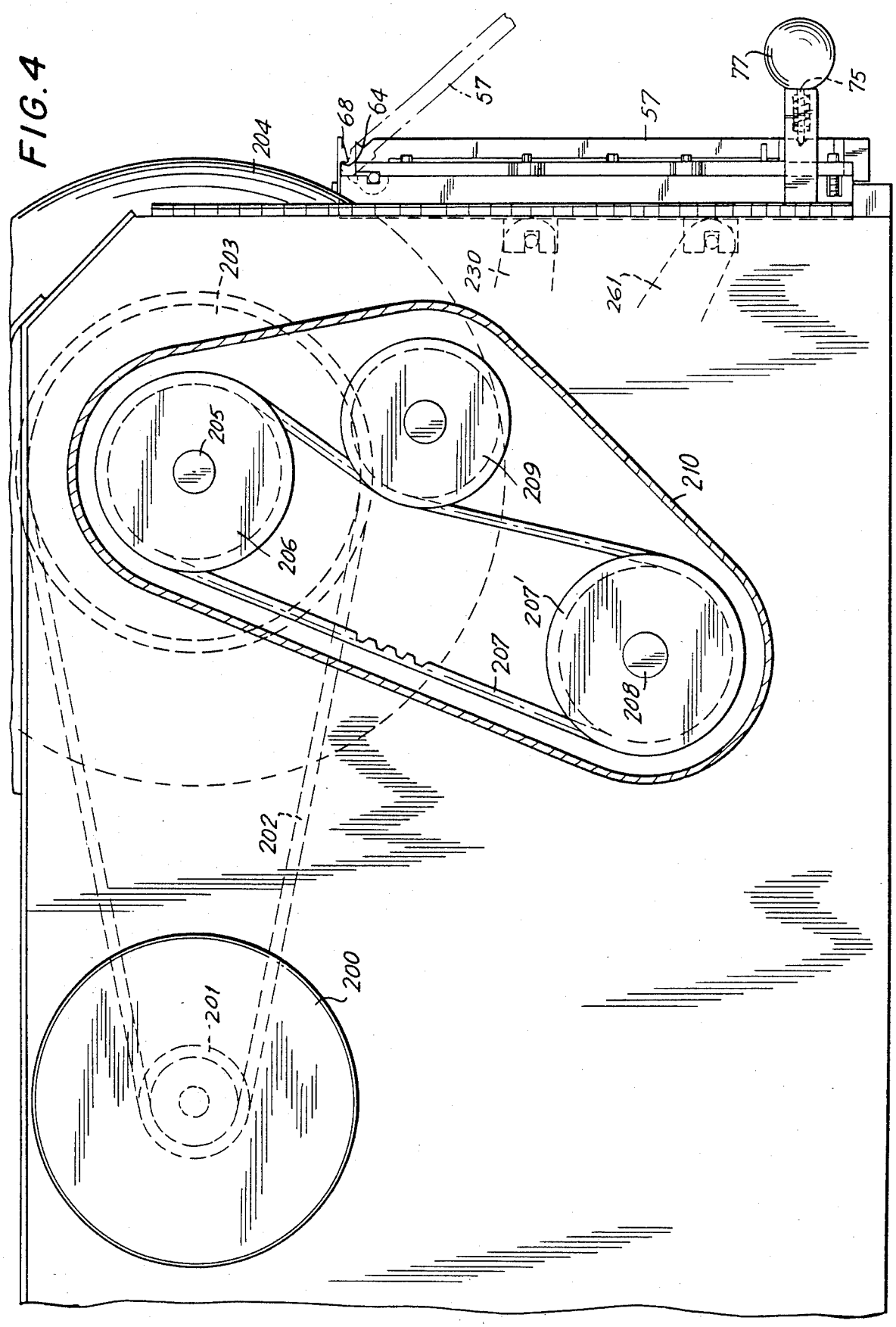
FIG. 4 is a vertical section taken on the line 4—4 of FIG. 2.
Figure 10:
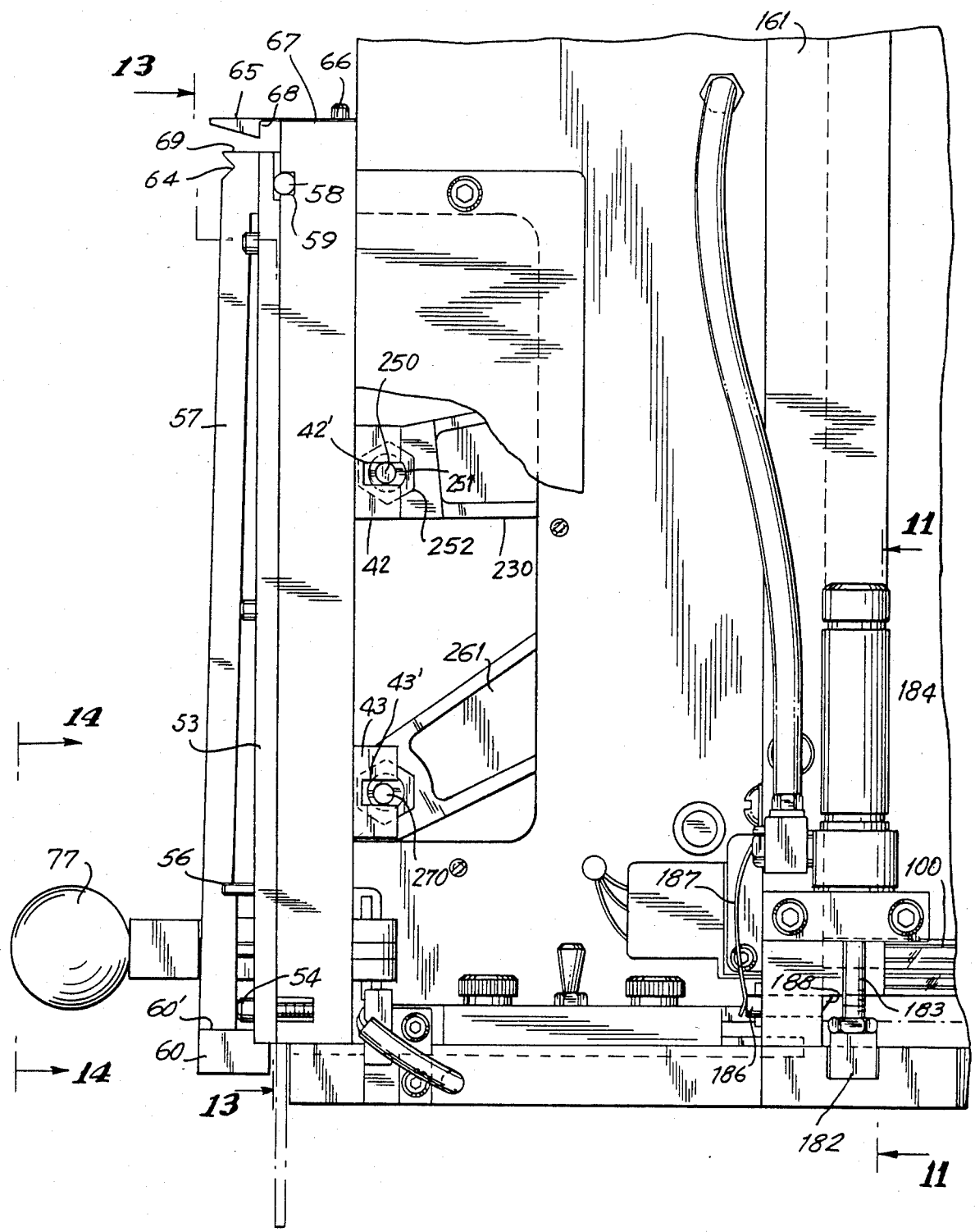
FIG. 10 is a side elevation taken in the direction of the arrows 10—10 of FIG. 2.

As will be best appreciated from an inspection from FIGS. 4, 10 and 23 the leaf spring 65 includes a depending detent member 68 which is normally spaced from the upper end 69 of the anvil carrier 57.

As best seen from said FIG. 4 when the carrier member 57 is pivoted upwardly a sufficient distance, the detent 68 will spring into the slot 64 and retain the anvil carrier in a clearing position providing access to the interior portions of the inserter mechanism.

The actuating sequence of the inserter mechanism is best appreciated from the sequential views represented by FIGS. 15 through 20.

In FIG. 15 there is disclosed an electronic component illustratively a capacitor C seated atop the forming surface 60' of the anvil 60. As will be explained hereinafter the capacitor is held in the noted position by spring forces urging the capacitor against the inner face of coverplate 53 adjacent the anvil, such position defining a forming station. In FIG. 16 the forming blades 44 and the stripper 46 are disclosed as having moved downwardly, the stripper blade 46 preceeding the movement of the forming blades 44 such as to capture the component C between the lowermost edge 46' of the stripper blade and the forming surface 60' of the anvil. Thereafter the forming blades 44—44 continue their downward movement to the position shown in FIG. 17. As will be apparent from the views, the interior opposed surfaces 60'' of the forming blades are recessed in a vertical direction, so as to provide guide channels for combing or slidably urging the projecting leads L of the capacitor C to positions adjacent the side edges of the anvil 60. The completely formed capacitor is disclosed in FIG. 17.

Following formation of the leads and proceeding from FIGS. 17 to FIG. 18 it will be apparent that the forming blades 44 and stripper 46 have risen slightly such as to relieve any pressure of the component C against anvil 60. It will likewise be perceived that by virtue of the resilience of the leads L of the component C, the component will be bodily raised from the anvil with the upward movement of the blades 44—44. At this juncture the anvil member 60 is shifted forwardly by mechanism to be hereinafter described so as to provide a clearance space in the area theretofore occupied by the anvil (see FIG. 18a). Thereafter the blades 44 and the stripper 46 move conjointly downwardly to the appropriately positioned PC board B, whereupon it will be perceived that the now downwardly deflected leads L have advanced through apertures 70 formed in the board B. The parts are shown in the noted location in FIG. 19.

Immediately following implacement of the component C, the drive mechanism, which is hereinafter described, urges the forming blades 44 in an upward direction in advance of any upward movement of the stripper blade 46. By this means it is assured that the component C will remain in its desired position adjacent the board until the forming blades 44 are cleared from engagement with the leads L. In FIG. 20 it will be seen that the lowermost ends of the leads L beneath the board B have been clinched by a clinching mechanism not shown.

Upon completion of the insertion cycle the parts will return to the initial or forming position shown in FIG. 15. In the course of such movement a next - in line component C will have been shifted forwardly into its desired position atop the anvil 60.

Figure 1:
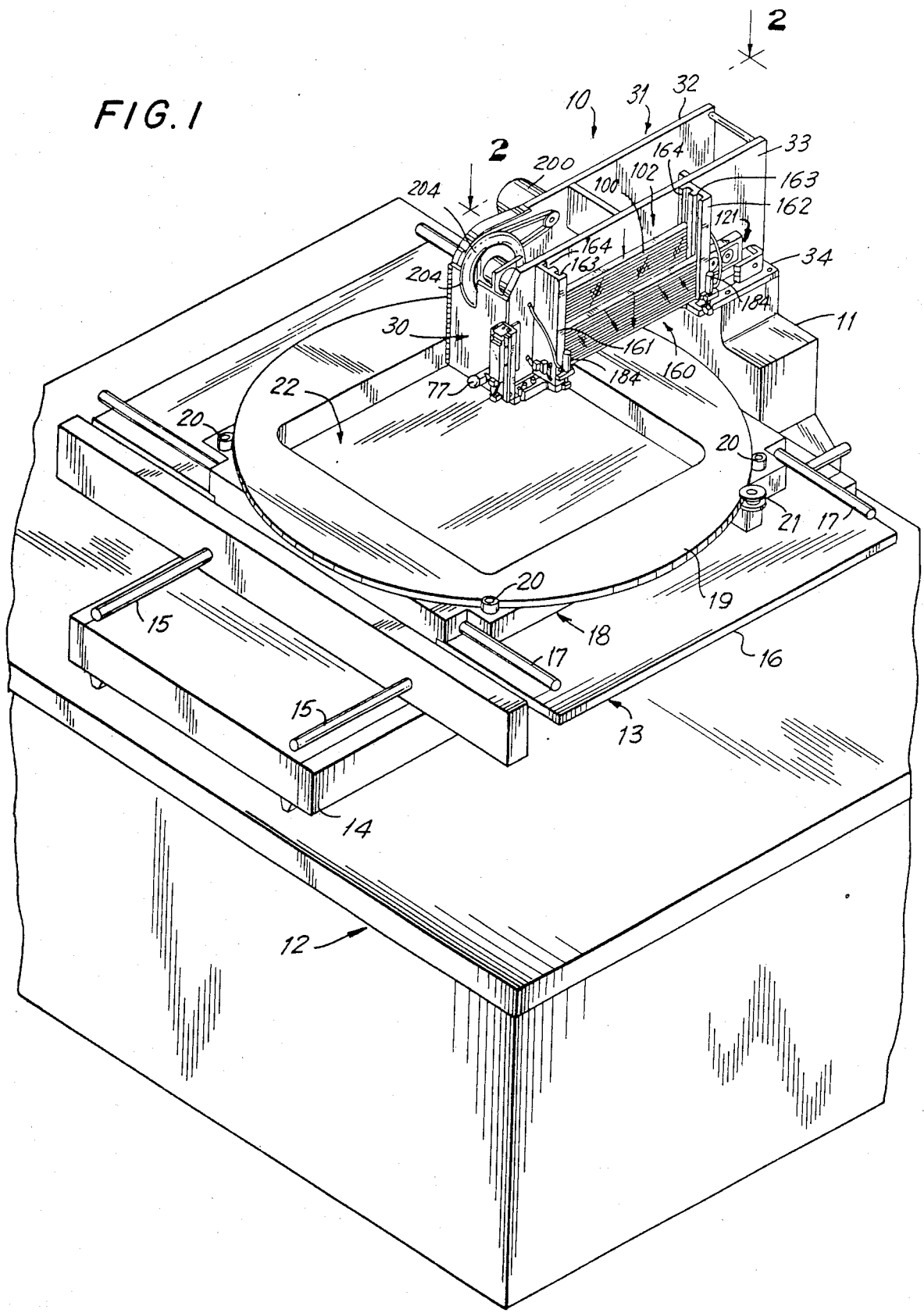
FIG. 1 is a perspective overall view of a device in accordance with the invention located above an X-Y table of conventional design.
Figure 2:
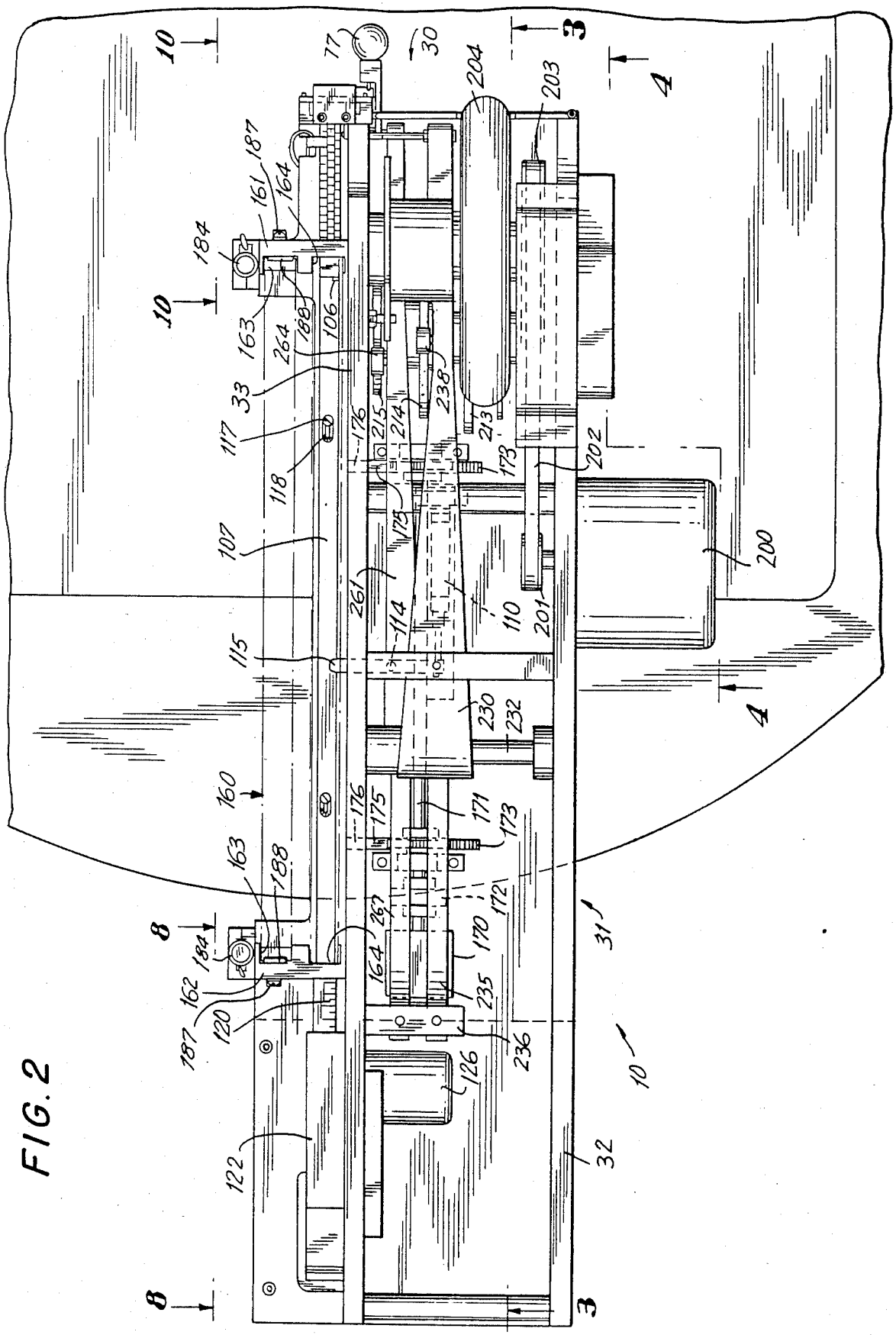
FIG. 2 is a top plan view of the unit on a magnified scale taken along line 2—2 of FIG. 1.
Figure 3:
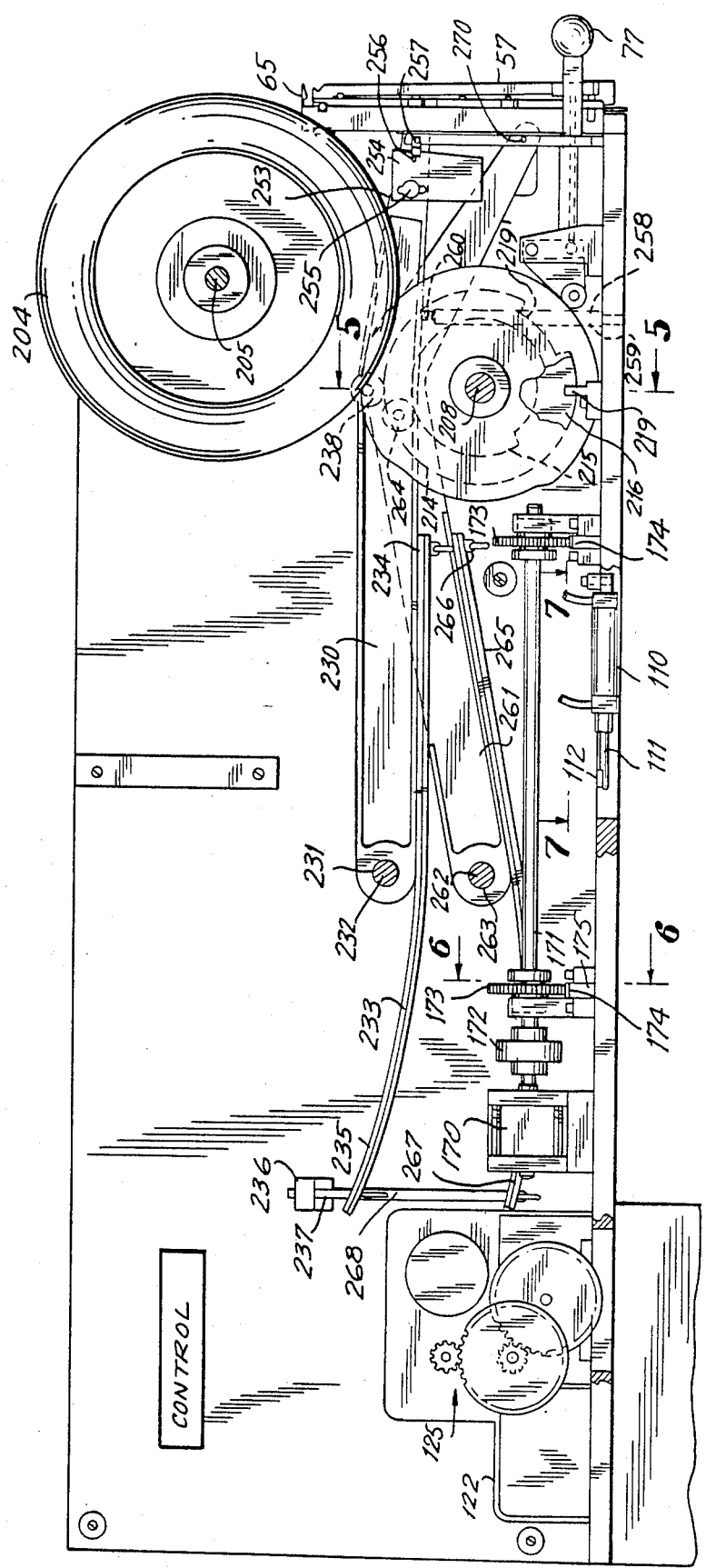
FIG. 3 is a vertical cross-section taken on the line 3—3 of FIG. 2.

The movements of the anvil as previously described are effected by mechanism shown in FIGS. 3, 21 and 22. The anvil carrier member 57 includes at its lower end 71 a laterally offset lug 72 formed with a vertically directed V-slot 73. A detent mechanism 74 (FIG. 21) includes a plunger 75 having a tapered forward end 76 which is seated in the groove 73. The plunger 75 at its outermost end is mounted to a retractor knob 77. A drive spring 78 is biased between shoulder 79 formed in a chamber 80 on the plunger assembly, the forward end of the spring 78 bearing against a flange 81 formed on the pin 75. It will thus be apparent that the spring 78 will urge the anvil carrier 57 in a rearward direction.

Mechanism is provided for oscillating the carrier member in a forwad direction against the biasing force of spring 78. The drive mechanism for the anvil carrier is comprised of a push rod 82 mounted in suitable bearings, the rear end 83 of the push rod being pressed against a link 84 having a drive pin 85 engaged against the rear end 83 of the push rod. The link oscillates forwardly and rearwardly as a result of the movements imparted to an extension arm 86, carrying a follower 87 engaged against the surface 88 of anvil drive cam 213 forming a part of the drive mechanism to be described hereinafter.

As will be more completely described hereinafter with each rotation of the drive cam 88 the follower 87 will be shifted forwardly and rearwardly. Movement of the push rod 82 is communicated to the anvil carrier 57 by engagement of the forwardmost end 89 of the push rod 82 against a rearwardly directed surface of the anvil carrier 57 (see FIG. 21).

In the event of a jam at the inserter mechanism it would be merely necessary to push the knob 77 to the left, unseating the forwardmost end 76 of plunger 75, from slot 73. In this position it is possible to pivot the mechanism in a clockwise direction as viewed in FIG. 21 about the pivot pin 90 secured to the frame. With the part thus located the anvil carrier 57 may be pivoted upwardly about pin 58 until detent 68 rests in notch 64 maintaining the carrier in the raised position shown in FIG. 4 in dot and dash lines.

ARTICLE POSITIONING MECHANISM

As will be appreciated from the preceeding discussion means are provided for sequentially feeding individual capacitors C in position to be formed and fed. The operation of the article feed mechanism is best appreciated from an inspection of FIGS. 1, 3, 9 and 12. In accordance with the invention the capacitors C are disposed within elongate magazine-like members 100, which in substance comprise elongate polymeric members tubular in transverse section (see FIG. 11). The magazine preferably includes spaced pairs of opposed flanges 101, the spacing of the flanges being such as to provide clearance for the body portion of the capacitors while the leads L extend laterally through the spaces defined between the closest approaching portions of the flanges 101. It will thus been seen that the capacitors C are free to shift axially of the magazine 100, but are not tiltable relative thereto. As will be appreciated from the ensuing discussion a multiplicity of magazines 100 are mounted in a magazine feed section 102 which functions to seratium position exhausted magazines in an exhaust chute or channel 163 and advance fresh magazines from an infeed chute 164 into operative position for feeding to the inserter mechanism.

The magazine members 100 are held with their forwardmost or feed end 103 adjacent a short article feed track 104 which leads a series of articles from the forwardmost end of the magazine to a delivery station 105 adjacent the rearmost end of the anvil 60.

The magazine member 100 is held with its forwardmost end against a forward detent 106 of a heightwise extend sufficiently small not to interfere with forward feed of articles from the magazine. The detent 106 is formed on the forward end of a slide member 107 which is reciprocable forwardly and rearwardly in a channel 108 formed in the frame. The slide member includes a rear detent 109, the size of the magazine 100 being such as to fit intimately between the spaced members 106 and 109.

The slide member may be articulated forwardly and rearwardly within channel 108 by an air cylinder 110 including a piston rod 111 connected to one end 112 of a drive lever 113 pivoted as at 114 to the frame. The drive end 115 of the lever rides in a drive slot 116 formed on the slide 107. The slide is retained in the channel as by a pin and retaining ring 117 which rides in recessed groove 118. The drive cylinder 110 positions the magazine in two descrete positions, noteably a forwardmost or feed position shown in phantom lines in FIG. 7 wherein the forwardmost end of the magazine will lie immediately adjacent the beginning of the feed track 104, and a rearward or discharge-refill position shown in solid lines in FIG. 7, whereat the forwardmost end of the magazine is spaced rearwardly from the track 104.

With the magazine shifted to its forwardmost position as described there will next be recited the means for individually feeding separate members C from the magazine into the feed track 104 and ultimately onto the anvil. This mechanism in essence includes a tape member comprised of steel ribbon 120 which is convoluted about a conventional tape spool 121, such as a standard measuring tape.

The tape spool 121 is contained in a housing 122 fixed to the rear end of the inserter apparatus. The tape member 120 extends through the length of the magazine 100 and presses against the rearmost of the components C.

Figure 12:
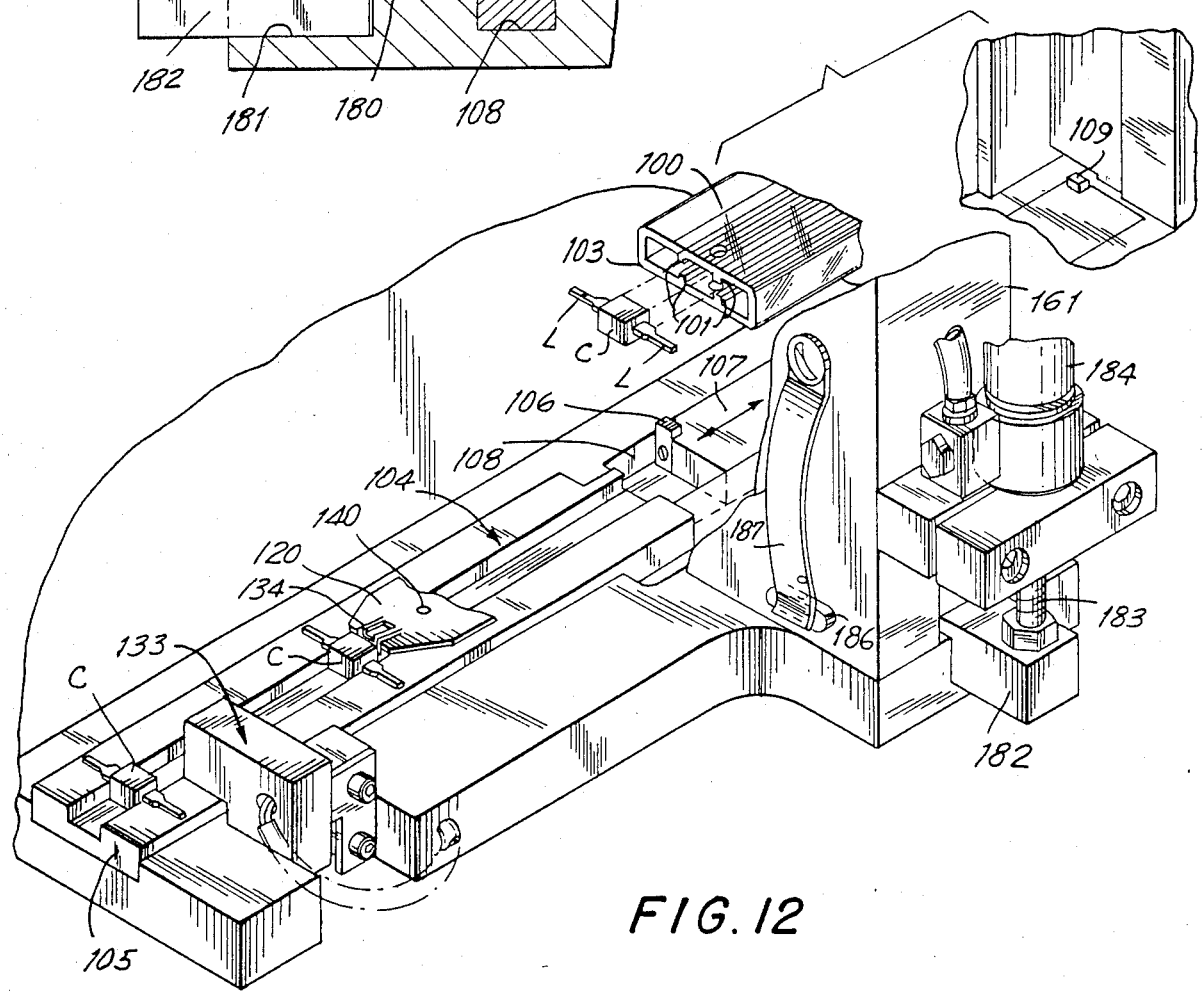
FIG. 12 is a fragmentary exploded perspective view of the magazine feeding station.

The tape 120 is depicted adjacent its forwardmost position in FIG. 12. The tape member is fed in a forward direction under constant force by a tape drive mechanism 125. Drive mechanism 125 includes a constant speed reversable drive motor 126 acting through reduction gear systems 127 and 128 against an electric hysteresis clutch member 129. The tape 120 is compressed between friction roll 130 and a compression roll 131 (see FIG. 9).

From the foregoing it will be understood that the articles will be fed at a constant force which is dependent upon the current fed to the hysteresis clutch member 129. It will be further understood that the tape 120 may be fed either forwardly toward the anvil or retracted rearwardly from the anvil dependent upon the sense in which the motor 126 is driven.

Means are provided for shifting the tape 120 rearwardly after it has moved to a predetermined forward position signaling the exhaustion of supply of components C from a given magazine. Without limitation and by way of example the sensor may comprise a magnetic or like sensor 133 which is calculated to detect the approach at a predetermined distance of a metallic pusher component 134 at the lead edge of the tape. It will understood that the forwardmost article in the group will be pressed by the tape against a stop surface formed on an inner face of coverplate 53. When the component 134 is sensed to have approached at a predetermined location relative to the sensor mechanism 133 the motor 126 is energized in a reverse direction and the tape 120 is retracted into the housing 122. Further sensing means (not shown) are provided to signal that the tape has reached its rearwardmost position. Any suitable mechanism may be employed to avoid the possibility of the tape reeling fully on to the spool 121. Optionally, but preferably, the tape 120 may be provided with an aperture 140 and a switch mechanism 141 may include a pawl 142 spring biased to project through the aperture in the tape when the latter has reached its retracted position.

Figure 7:
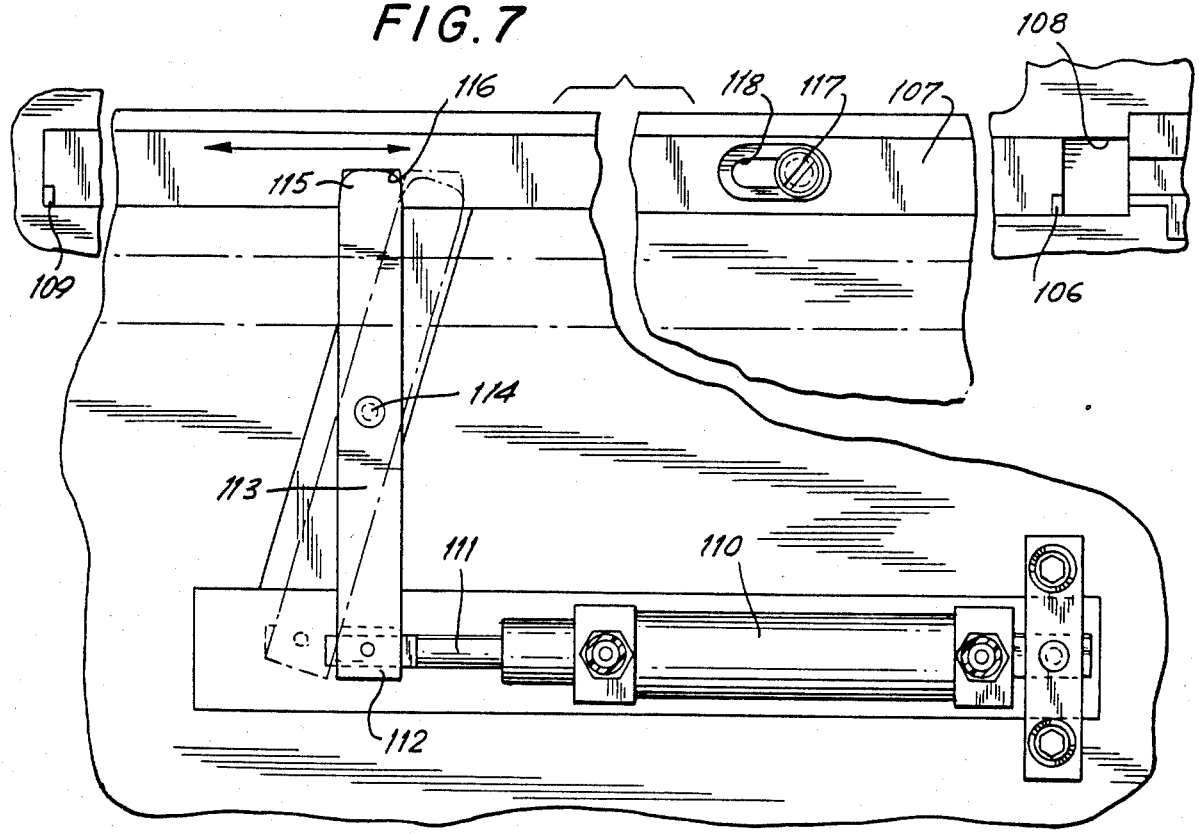
FIG. 7 is a magnified section taken on the line 7—7 of FIG. 3.

It will be understood that when the sensor mechanism or switch 141 is energized signaling retraction of the tape, the piston 110 is activated to shift the slide 107 from the dot and dash to the solid line position shown in FIG. 7. In such position the exhausted magazine will be located such as to be subject to handling by the magazine refilling mechanism which will next be described.

MAGAZINE FEED, EJECT AND STACK MECHANISM

The magazine refilling mechanism 160 is comprised of a pair of vertical forward and rearward plates 161-162 respectively (See FIG. 1.) each of which plates includes a pair of channels, namely 163—163 defining the outfeed channel for exhausted magazines and 164—164 defining an infeed channel for fresh magazines.

In normal operation the channel 164 is manually stacked or filled with a series of loaded magazines. After the tape mechanism has retracted to the reel as herein before described and the slide member 107 is shifted to the retracted position, the exhausted magazine held between the detents 106 and 109 will be aligned with the space between the plates 162 and 163.

Figure 6:
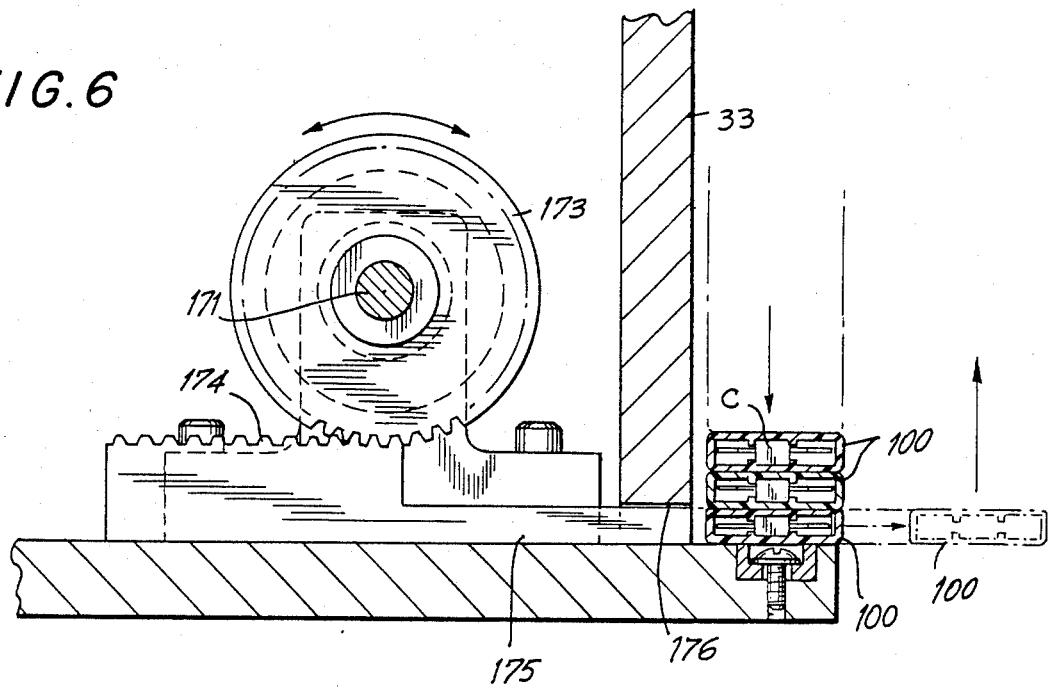
FIG. 6 is a magnified section taken on the line 6—6 of FIG. 3.

The apparatus includes lateral feed mechanism for shifting an exhausted said magazine 100 into the area in registry with the exhaust channels 163—163 from its initial or loaded position in registry with the infeed channels 164—164. The lateral feed mechanism includes a rotary actuator member 170 (FIG. 3) in driving connection with a shaft 171 via coupling 172. The shaft 171 carries a pair of spur gears 173—173 which mesh with rack members 174—174 (See FIG. 6).

At the forward end of rack 174 there is formed an extension 175 passing through a horizontal slot 176 formed in plate 33. Upon actuation of the spur gear in anti-clockwise direction, as viewed in FIG. 6, it will be apparent that the lowermost said magazine 100 will be shifted from the solid line to the dot and dash line position shown in FIG. 6. When the magazine has been shifted to the dot and dash position shown in FIG. 6 it will have been shifted from alignment with channel 164 into alignment with outer or exhaust channel 163.

Figure 11:
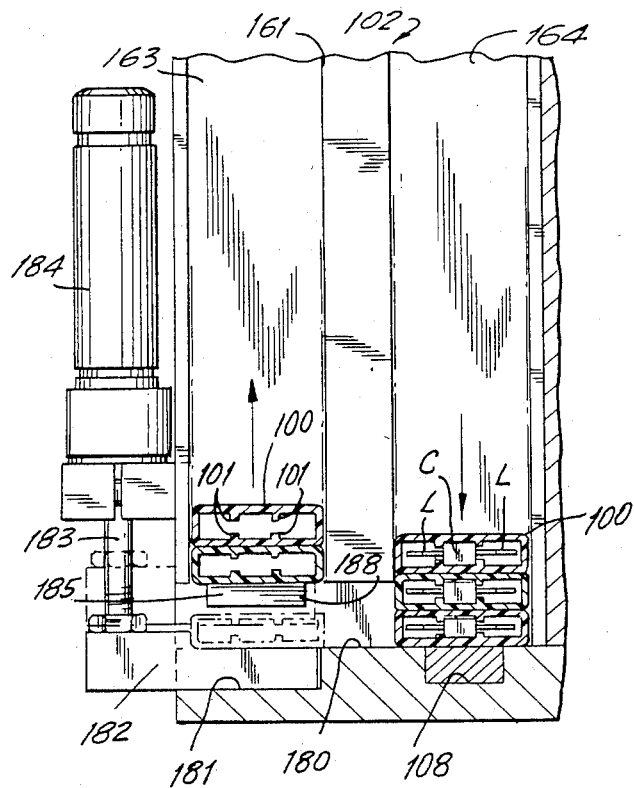
FIG. 11 is a section taken on the line 11—11 of FIG. 10.

It will be understood that the magazines are laterally shiftable along a support surface 180 (FIG. 11), the surface 180 being recessed at 181 in the area in registry with the outfeed channel 163. When the magazine is shifted laterally outwardly as described and as shown in FIG. 11 in dot and dash lines the same will rest upon a forward and rearward pair of fingers 182—182 supported from the piston rod members 183 of air cylinder 184—184. Responsive to the lateral shifting movement a sensing mechanism is activated to energize the air cylinders 184—184 through a lifting movement from the solid line to the dot and dash line positions shown in FIG. 11.

The magazines are retained in their lifted positions by a spaced pair of detents 185—185 the rearwardmost ends 186 of which project outwardly of the channel members 161-162. The detents 185 are spring biased inwardly into underlying relation of magazines in the exhaust channel 163 by leaf springs 187. The detent members include downwardly inclined cam surfaces 188 which coact with the upwardly shifted magazine members in such manner as to cam the detent members outwardly until the magazine has passed to a level above the detents, whereupon the spring members 187 will shift the detents 185 inwardly and the column of exhausted said magazines will be supported on the upper surfaces of the detents.

As will be evident from the preceeding description filled magazines in the infeed track 164 will be succesively exhausted thereupon shifted laterally into registry with the outfeed tracks 163, thereupon being shifted upwardly into supported relation on the detents 186.

SYNCHRONOUS DRIVE SYSTEM

The drive system (FIGS. 2, 3, 4, 5, and 9) includes a drive motor 200 having drive pulley 201 connected via belt 202 to input pulley 203 which is coupled to flywheel member 204. The flywheel is thus continuously driven by the motor 200. A spring wrap single revolution clutch (not shown) is interposed between the flywheel and a clutch output shaft 205. It is the function of the clutch which is known per se to communicate or couple the output shaft 205 to the flywheel 204 to complete a single revolution responsive to an electrical pulse impressed on the clutch mechanism. A drive pulley 206 is fixed to the clutch output shaft 205. A timing belt 207 links drive pulley 206 with cam drive pulley 207' fixedly mounted on cam support shaft 208. Preferably an idler pulley 209 presses against the belt 207 to maintain the same in tensioned condition. The pulleys 207, 206 and 209 are preferably disposed within a protective housing 210 fastened to the outerface of left frame plate 32.

Figure 5:
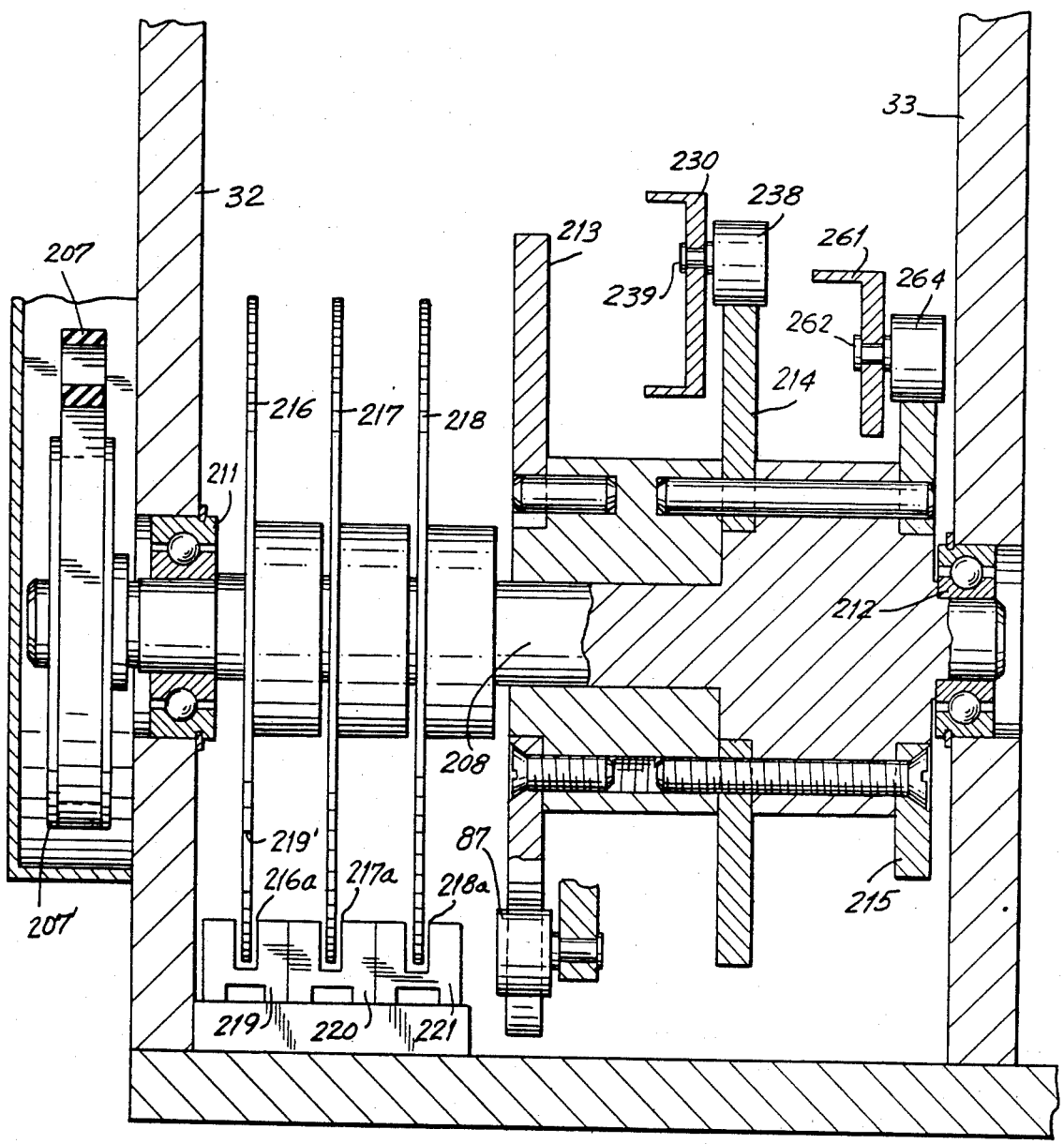
FIG. 5 is a magnified section taken on the line 5—5 of FIG. 3.

The cam drive shaft 208 is mounted between bearings 211-212 supported in axially aligned position on the main vertical plates 32 and 33 respectively (FIG. 5). During each operative cycle of the machine the cam shaft 208 is rotated through one complete revolution by its intermittant connection with the flywheel 204 via the clutch.

On the drive shaft 208 and mounted for rotation therewith are the control cams 213, 214, 215 for the anvil 60, the stripper blade 46 and the forming blades 44 respectively. Additionally, the shaft 208 carries three timing disks 216, 217 and 218 which function to interface the timing of the inserter apparatus with the movements of the X-Y positioning table.

More particularly, the timing disks 216, 217 and 218 which are angularly adjustable relative to the shaft 208 include arcuate cutout portions, e.g. portion 219' FIG. 3. The peripheral portions of the timing disks ride within slots 216a, 217a and 218a of optical sensors 219, 220 and 221 respectively. The optical slot sensors may include a light emitting diode (LED) at one side and a photo responsive transistor on the other side of the slot. The disks function to block the transmission of light across the slot during the period that the periphery is uninterrupted. When a recessed portion of the periphery is aligned with the space between the LED and the photo transistor, pulses are sent to coordinate with other elements of the apparatus.

By way of example, when the recessed peripheral portion of disk 216 is aligned in slot 216a a signal is sent to the X-Y table apparatus to cut and clinch an inserted unit. The signal generated by the disk 217 may be employed to control or check the height of an inserted unit. The third timing disk 218 may be employed to generate a signal indicating that the inserter mechanism has retracted sufficiently far to permit the positioner system to move the PC board within the X-Y table to a next position. As noted hereinabove the timing of the apparatus may be fine tuned by angularly rotating the disks 216, 217, 218 relative to the shaft 208 until a desired adjustment is obtained.

The anvil control cam 213 functions to shift the anvil member 60 inwardly and outwardly in timed relation synchronized with the functioning of the stripper and forming blades. Movement of the anvil is effected by follower roller 87 previously described which is biased against the drive surface 88 of the anvil drive cam 213.

Movement is communicated to the stripper blade 46 by a stripper arm member 230 next to be described. The arm 230 (FIG. 3) which may comprise an aluminum casting, includes a pin 232 at its rearward end, which pin is supported in two bushings 231, FIG. 2, fixedly mounted in the vertical plates 32-33. The arm 230 is spring biased downwardly by a leaf spring 233, a forward end 234 of which is removably fixed to the undersurface of arm 230. The rearend 235 of spring 233 is mounted to support block 236 via hanger rod 237. Optionally, a removable connection may be interposed between the rod 237 and spring end 235. The arm 230 includes a follower roller 238 supported on stub shaft 239 fixed to arm 230. As will be appreciated from the foregoing, the tension of the spring 233 will press the arm 230 downwardly whereby the follower roller 238 is maintained in constant contact with the periphery of stripper drive cam 214.

As best seen in FIG. 10 a driving connection between the stripper drive arm 230 and the stripper carrier 42 is effected by a drive pin 250 which rides in the slot defined by the drive fork 42' of the stripper carrier. Preferably, as best seen in FIG. 10, the pin 250 is mounted eccentrically relative to a pin support head 251 secured within a complemental bore formed in the arm 230. An elastic stop nut 252 is threaded over the pin adjacent is connection to the arm. By means of the eccentricity of the pin 250 relative to the pin head 251 it will be appreciated that a degree of adjustability in vertical direction may be achieved by loosening the stop nut 252 and relatively rotating the pin head 251 on the arm 230 and thereafter retightening the stop nut 252.

Preferably, the arm 230 adjacent its forward end 253 may include a vane member 254 comprised of a thin sheet of metal vertically adjustably mounted as at slot and clamp connection 255 to the arm 230. The vane 254 may includes a transverse slot 256 which is coordinated with a slot sensor 257, the slot and sensor functioning to control or signal that the stripper blade has reached a desired lowermost position relative to the PC board. The sensor 257 may function as a fail-safe or stop device to shut off the apparatus in the event that the desired heightwise finishing position of the stripper blade is not achieved.

In order to prevent undue pressure on a component as the same is inserted into the PC board by the stripper blade, particularly at the final stages of such movement, there is provided a spring biased assembly 258 best seen in FIG. 3. The assembly 258 comprises a tube 259 housing a spring (not shown) biased against the lowerend of a plunger 260, the upper surface of which is positioned beneath the lower surface of the arm 230. As the arm 230 approaches its lowermost position under the pressure of the leaf springs 233 it will be seen that the downward forces of the leaf springs are in part offset by the upward force against the arm provided by the plunger 260. By this means the high spring forces generated by the leaf spring 233 and necessary to maintain the follower 238 in contact with the rapidly rotated cam 214 are not transmitted to the electronic components.

In a similar fashion up and down vertical movement is transmitted to the former blades 44—44 mounted in blade carrier 43 by drive arm 261. The arm 261 is mounted on pivot pin 262 via interposed bushing 263 (FIG. 3). The follower member 264 is biased against the surface of former control cam 215 by leaf springs 265 the forward ends 266 of which are removeably connected to the under surface of the arm 261, and the rear ends 267 of which are removably secured to a depending support 268 depending from support block 236.

Connection between the former drive arm 261 and the former blade carrier 43 is effected by drive pin 270 (FIG. 10) which is disposed in the slot 43' of the former blade carrier 43. The pin 270 is mounted eccentrically relative to the arm 261 as is pin 250, so as to permit a degree of vertical adjustment by relatively rotating the pin 270 and the arm 261.

As will be immediately appreciated by those skilled in the art numerous sensor mechanisms may be provided on the X-Y table apparatus and the inserter apparatus for assuring that the two devices properly interface. More particularly, a signal derived from the X-Y table device responsive to the device achieving a desired inserted position may be used to trigger the inserter device through an operative cycle. Similarly, one or more signals derived from the inserter device and indicating a completion of the insertion cycle and retraction of the insertion mechanism may be employed to signal the X-Y table to index to its next programed insertion position.

From the foregoing description it will understood that there is provided in accordance with the present invention a mechanism, apparatus and method for processing components, illustratively capacitors, to rapidly and efficiently mount the same in a desired position in a printed circuit board.

The apparatus in its illustrated embodiment contemplates the use of elongate tubular carrier members or magazines loaded with a column of components in side to side relationship. In accordance with the invention magazines are loaded at an infeed station and emptied magazines discharged at an outfeed station, exhausted magazines being expressed and new magazines loaded without any interruption in the operation of the machine. In accordance with the invention the time frame within which an exhausted magazine is expressed and a new magazine loaded is sufficiently short that the remaining group of components adjacent the feeder apparatus, but external of the magazine i.e. the units in track section 104, may be processed within the time taken for substitution of a full for an empty magazine.

The device is capable of processing electronic components at the rate of 10,000 or more units per hour, the processing rate now being dependent upon the effectiveness of the auxiliary equipment employed, i.e. the X-Y table.

Pursuant to the requirements of the Patent Laws the illustrated device has been disclosed in its best mode, which illustration necessarily include details of the structure for which equivalent mechanism may be readily devised. In particular, movements which have been effected by cam, cam followers, springs and the like could be equally well accomplished by air cylinders, solenoids and like driving mechanisms. Accordingly, the invention is to be broadly construed within the scope of the appended claims.

Having thus described the invention and illustrated its use, what is claimed as new and is desired to be secured by Letters Patent in the United States is:

1. Apparatus for the automatic insertion into a device at an insertion station of a capacitor or like electronic component having a body portion and leads extending axially from the distal ends of said body portion comprising a forming station, an applicator assembly for receiving a component at said forming station, bending said leads relative to said body portion, and inserting the distal ends of said leads into said device at said insertion station, a feed assembly for supplying components seriatum at said forming station, said feed assembly including elongate magazine means having a feed channel sized to support a multiplicity of components in side to side engagement, an elongate pusher member disposed in said channel in engagement with an endmost one of said components, pusher drive means yieldably urging said pusher member axially of said channel toward said forming station, to thereby urge a column of components in said magazine toward said station, and sensor means adjacent said forming station for retracting said pusher member from said magazine responsive to proximate approach of said pusher member toward said forming station.

2. Apparatus in accordance with claim 1 wherein said pusher member includes a spring tape shiftable between a retracted coiled position and an extended generally linear condition.

3. Apparatus in accordance with claim 2 and including friction drive wheel means engaged against said tape, idler means engaging said tape at a location opposite the area of engagement of said friction drive wheel means, said pusher drive means including a drive motor operatively connected to said drive wheel means.

4. Apparatus in accordance with claim 3 wherein said idler means comprises a wheel member, said apparatus including spring means urging said wheel member and friction drive wheel means toward each other and against opposed surfaces of said tape to thereby drive said tape with a force which is a function of the pressure of said spring means.

5. Apparatus in accordance with claim 1 wherein said feed channel of said magazine means includes an enlarged central zone extending longitudinally of said magazine means, said zone being sized to slideably receive said body portions of said components, said magazine including in addition longitudinally extending, laterally directed clearance zones sized to receive said leads of said components.

6. Apparatus in accordance with claim 1 and including a base plate having a first end portion disposed adjacent said feed station, a guide chute directed toward said base plate, said plate forming a boundary of said chute, said chute being sized to permit movement of said magazines toward said base plate along a path extending generally normal to said base plate.

7. Apparatus in accordance with claim 6 and including a laterally open clearance slot adjacent said base plate and a magazine clearance means for shifting an empty magazine laterally through said slot to a magazine discharge station responsive to proximate approach of said pusher member toward said forming station.

8. Apparatus in accordance with claim 7 and including a discharge receiver chute parallel to and laterally offset from said guide chute, said discharge receiver chute being in registry with said discharge receiver station.

9. Apparatus in accordance with claim 8 and including means for shifting an empty magazine at said magazine discharge station into said discharge receiver chute.

10. Apparatus in accordance with claim 8 and including spring biased detent means in said discharge chute in the path of said magazines, said detent means including cam means directed toward said station, said cam means being positioned to shift said detent means clear of said path responsive to upward movement of a said magazine into said discharge receiver chute.

* * * * *